(12) United States Patent
Pandya et al.

(10) Patent No.: US 10,488,463 B2
(45) Date of Patent: Nov. 26, 2019

(54) METHOD AND SYSTEM FOR MEASURING A PROPAGATION DELAY AND TRANSMITTANCE OF A DEVICE UNDER TEST (DUT)

(71) Applicant: InspiRain Technologies Pte Ltd, Singapore (SG)

(72) Inventors: Harshang Nileshkumar Pandya, Singapore (SG); Minglei Cui, Singapore (SG)

(73) Assignee: INSPIRAIN TECHNOLOGIES PTE LTD, Singapore (SG)

( * ) Notice: Subject to any disclaimer, the term of this patent is extended or adjusted under 35 U.S.C. 154(b) by 381 days.

(21) Appl. No.: 15/595,359

(22) Filed: May 15, 2017

(65) Prior Publication Data

US 2018/0328990 A1   Nov. 15, 2018

(51) Int. Cl.
| | | |
|---|---|---|
| *G01R 31/28* | (2006.01) | |
| *G01R 31/319* | (2006.01) | |
| *G01R 31/317* | (2006.01) | |
| *G01R 31/02* | (2006.01) | |
| *G01R 31/3193* | (2006.01) | |

(52) U.S. Cl.
CPC ... *G01R 31/31937* (2013.01); *G01R 31/2834* (2013.01); *G01R 31/2837* (2013.01); *G01R 31/31725* (2013.01); *G01R 31/021* (2013.01); *G01R 31/2839* (2013.01); *G01R 31/31917* (2013.01)

(58) Field of Classification Search
CPC .......... G01R 31/31937; G01R 31/3193; G01R 31/31725; G01R 31/317; G01R 31/2837; G01R 31/28; G01R 31/2834; G01R 31/2839; G01R 31/02; G01R 31/021; G01R 31/319; G01R 31/31917
See application file for complete search history.

(56) References Cited

U.S. PATENT DOCUMENTS

| | | | | |
|---|---|---|---|---|
| 5,867,030 A | * | 2/1999 | Sato ................. | G01R 31/31937 324/533 |
| 6,823,022 B1 | * | 11/2004 | Fullerton ............... | H04B 1/719 375/285 |
| 2002/0011865 A1 | * | 1/2002 | Takagi ............. | G01R 31/31937 324/756.07 |
| 2013/0002274 A1 | * | 1/2013 | Saneyoshi .......... | G01R 31/2849 324/750.01 |

* cited by examiner

*Primary Examiner* — Son T Le
(74) *Attorney, Agent, or Firm* — Carlson, Gaskey & Olds, P.C.

(57) ABSTRACT

The invention provides a method and system for measuring a propagation delay of a device under test (DUT) using a first measurement unit and a second measurement unit. A first periodic signal transmitted from the first measurement unit via the DUT is received at the second measurement unit as a first delayed periodic signal. The first delayed periodic signal is then compared with a second periodic signal at the second measurement unit to generate the second comparison phase output. Similarly, the second periodic signal transmitted from the second measurement unit via the DUT is received at the first measurement unit as a second delayed periodic signal. The second delayed periodic signal is then compared with the first periodic signal at the first measurement unit to generate the first comparison phase output. Thereafter, the propagation delay is calculated by combining the first comparison phase output and the second comparison phase output.

20 Claims, 7 Drawing Sheets

METHOD AND SYSTEM FOR MEASURING A PROPAGATION DELAY AND TRANSMITTANCE OF A DEVICE UNDER TEST (DUT)

FIELD OF THE INVENTION

The invention generally relates to a measurement of end-to-end transmission properties of a device under test (DUT) or a communication channel. More specifically, the invention relates to a measurement of a propagation delay of a DUT and measurement of a transmittance both in a frequency domain and in a time domain representation of the transmittance (TDT).

BACKGROUND OF THE INVENTION

In general, two important aspects of end-to end signal transmission performance of a device under test (DUT) or a communication channel are a shape of an impulse response of the DUT or the communication channel and a propagation delay of the DUT or the communication channel. These two important aspects are used in transmittance measurements that are further utilized in applications for characterizing multipath propagation effects, dispersion effects in optical cables, impedance spectroscopy of large objects and propagation delay skew. In order to utilize the transmittance measurements in various applications, the propagation delay in the DUT needs to be measured initially.

There are several techniques known in the art for measuring the propagation delay of the DUT and the transmittance. One such measurement technique employs a vector network analyzer (VNA) as a measurement unit in which two ends of the DUT are connected to the same measurement unit. The measurement unit sends a test signal from a transmitter port of the measurement unit to the DUT and receives a signal from the DUT at a receiver port of the measurement unit. The measurement unit, then, calculates transmission properties of the DUT by measuring a S-parameter for the transmittance at a plurality of frequencies.

Further, in another measurement technique, the propagation delay in the DUT is measured by performing reflectometry using either a time domain reflectometer or a frequency domain reflectometer. In a reflectometry based measurement unit, a first end of the DUT is connected to a test port of the measurement unit and a second end of the DUT is connected to a reflective termination. For measuring the propagation delay in the DUT, a source of the measurement unit generates an excitation signal and provides the excitation signal to a directional coupler. The directional coupler further transmits the excitation signal to the DUT through the test port. Thereafter, a receiver of the measurement unit receives a signal reflected from the reflective termination. Thereafter, a receiver of the measurement unit calculates the propagation delay between the excitation signal and the reflected signal.

However, the measurement techniques using the VNA are not capable of performing a dual-ended phase-sensitive testing for a large DUT such as a long cable, as a length of the DUT makes it impossible to connect two ends of the DUT to the same measurement unit. Further, the measurement techniques using the reflectometer do not provide a required accuracy in a measurement of the propagation delay. Also, the reflectometer based measurement techniques are not suitable for measurements for DUTs having multiple ports, an example of such measurement being Far End Cross-talk (FEXT) for multi-conductor cables. Further, the existing techniques are not suitable for vector S-parameter measurement of FEXT.

Therefore, in light of the above, there is a need for a method and system for performing a dual-ended propagation delay measurement and transmittance measurement without requiring a common phase reference between two independent measurement units, wherein the two independent measurement units may not have any physical or conductive electrical connection between them.

BRIEF DESCRIPTION OF THE FIGURES

The accompanying figures where like reference numerals refer to identical or functionally similar elements throughout the separate views and which together with the detailed description below are incorporated in and form part of the specification, serve to further illustrate various embodiments and to explain various principles and advantages all in accordance with the invention.

Figure 1:
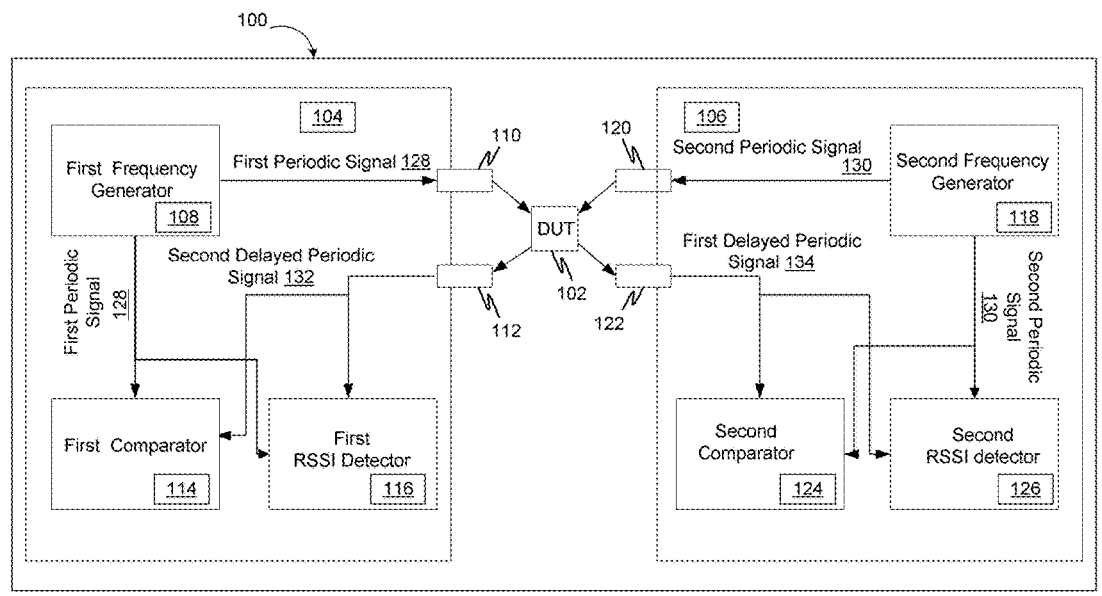
FIG. 1 illustrates a system for measuring a propagation delay of a device under test (DUT) in accordance with an embodiment of the invention, wherein the DUT is a bi-directional DUT.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION OF THE INVENTION

Before describing in detail embodiments that are in accordance with the invention, it should be observed that the embodiments reside primarily in combinations of method steps and system components related to a measurement of a propagation delay of a DUT and measurement of a transmittance both in a frequency domain and in a time domain representation of the transmittance (TDT).

Accordingly, the system components and method steps have been represented where appropriate by conventional symbols in the drawings, showing only those specific details that are pertinent to understanding the embodiments of the invention so as not to obscure the disclosure with details that will be readily apparent to those of ordinary skill in the art having the benefit of the description herein.

In this document, relational terms such as first and second, top and bottom, and the like may be used solely to distinguish one entity or action from another entity or action without necessarily requiring or implying any actual such relationship or order between such entities or actions. The terms "comprises," "comprising," or any other variation thereof, are intended to cover a non-exclusive inclusion, such that a process, method, article or composition that comprises a list of elements does not include only those elements but may include other elements not expressly listed or inherent to such process, method, article or composition. An element proceeded by "comprises . . . a" does not, without more constraints, preclude the existence of additional identical elements in the process, method, article or composition that comprises the element.

Various embodiments of the invention provide a method and system for measuring a propagation delay of a device under test (DUT) using two independent measurement units namely, a first measurement unit and a second measurement unit. The system includes a first frequency generator in the first measurement unit that generates a first periodic signal. Once the first periodic signal is generated, a first transmitter port of the first measurement unit transmits the first periodic signal from the first frequency generator to a first end of the DUT. The first periodic signal is then further transmitted to a second receiver port of the second measurement unit via a second end of the DUT as a first delayed periodic signal.

Similarly, a second frequency generator of the second measurement unit generates a second periodic signal. After generating the second periodic signal, a second transmitter port of the second measurement unit transmits the second periodic signal to the second end of the DUT. The second periodic signal is then further transmitted to a first receiver port of the first measurement unit via the first end of the DUT as a second delayed periodic signal.

Once the second delayed periodic signal is received at the first receiver port, a first comparator of the first measurement unit calculates a first comparison phase output by comparing a phase of the first periodic signal and the second delayed periodic signal. Similarly, once the first delayed periodic signal is received at the second receiver port, a second comparator of the second measurement unit calculates a second comparison phase output by comparing a phase of the second periodic signal and the first delayed periodic signal. Thereafter, the propagation delay is calculated by combining the first comparison phase output and the second comparison phase output.

FIG. 1 illustrates a system 100 for measuring a propagation delay of a DUT 102 in accordance with an embodiment of the invention, wherein DUT 102 is a bi-directional DUT. DUT 102 can be, but need not be limited to, a metallic cable, an optical fiber cable, an air, and a dielectric material.

Figure 2:
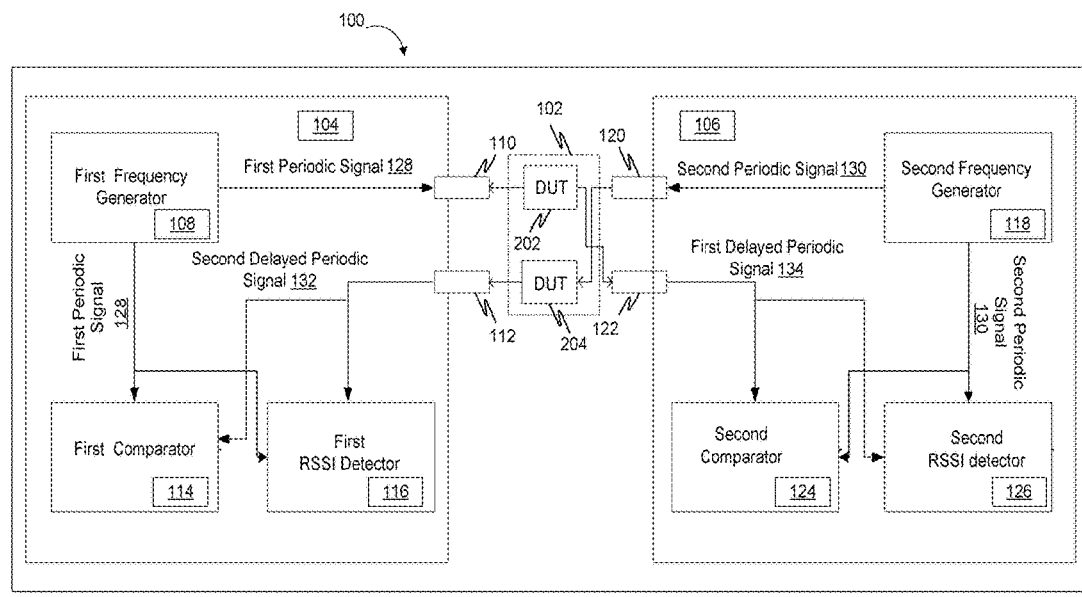
FIG. 2 illustrates a system for measuring a propagation delay of a DUT in accordance with an embodiment of the invention, wherein the DUT includes a forward DUT and a reverse DUT.

In another embodiment, DUT 102 may also include a forward DUT and a reverse DUT which is explained in detail in conjunction with FIG. 2.

Moving on, as illustrated, system 100 includes a first measurement unit 104 and a second measurement unit 106. First measurement unit 104 and second measurement unit 106 are independent measurement units that may not have any physical or conductive electrical connection between them.

First measurement unit 104 includes components such as, but not limited to, a first frequency generator 108, a first transmitter port 110, a first receiver port 112, a first comparator 114 and a first received signal strength indicator (RSSI) detector 116. The components of first measurement unit 104 are communicatively coupled to each other and to first end of DUT 102. Similarly, second measurement unit 106 includes components such as, but not limited to, a second frequency generator 118, a second transmitter port 120, a second receiver port 122, a second comparator 124 and a second RSSI detector 126. The components of second measurement unit 106 are communicatively coupled to each other and to second end of DUT 102.

FIG. 2 illustrates a system for measuring a propagation delay of DUT 102 in accordance with an embodiment of the invention, wherein DUT 102 includes a forward DUT 202 and a reverse DUT 204.

As illustrated, a first end of forward DUT 202 is communicatively coupled to first transmitter port 110 of first measurement unit 104 and a second end of forward DUT 202 is communicatively coupled to second receiver port 122 of second measurement unit 106. A first end of reverse DUT 204 is communicatively coupled to second transmitter port 120 of second measurement unit 106 and a second end of reverse DUT 204 is communicatively coupled to first receiver port 112 of first measurement unit 104.

Moving on, first frequency generator 108 of first measurement unit 104 generates a first periodic signal 128 that is fed into first transmitter port 110 of first measurement unit 104. First transmitter port 110, then, transmits first periodic signal 128 from first frequency generator 108 to first end of DUT 102.

In a similar manner, second frequency generator 118 of second measurement unit 106 generates a second periodic signal 130 that is fed into second transmitter port 120 of second measurement unit 106. Second transmitter port 120, then, transmits second periodic signal 130 from second frequency generator 118 to second end of DUT 102.

First receiver port 112 of first measurement unit 104 receives second periodic signal 130 transmitted through DUT 102 as a second delayed periodic signal 132. Second delayed periodic signal 132 is then fed into first comparator 114 of first measurement unit 104. First comparator 114 of first measurement unit 104, then, calculates a first comparison phase output by comparing a phase of first periodic signal 128 and second delayed periodic signal 132.

Second receiver port 122 of second measurement unit 106 receives first periodic signal 128 transmitted through DUT 102 as a first delayed periodic signal 134. First delayed periodic signal 134 is then fed into second comparator 124 of second measurement unit 106. Second comparator 124 of second measurement unit 106, then, calculates a second comparison phase output by comparing a phase of second periodic signal 130 and first delayed periodic signal 134.

Once the first comparison phase output and the second comparison phase output are computed, system 100 calculates the propagation delay of DUT 102 by combining the first comparison phase output and the second comparison phase output.

In accordance with an embodiment, a frequency of first periodic signal 128 is kept substantially the same as a frequency of second periodic signal 130 in order to minimize a measurement error in a measurement of the propagation delay.

In accordance with another embodiment, first frequency generator 108 and second frequency generator 118 are configured to produce periodic signals at a plurality of frequencies.

Moving on, first RSSI detector 116 of first measurement unit 104 determines a magnitude of second delayed periodic signal 132 and a magnitude of first periodic signal 128.

Further, second RSSI detector 126 of second measurement unit 106 determines a magnitude of first delayed periodic signal 134. Thereafter, system 100 uses the magnitude of first delayed periodic signal 134, the magnitude of first periodic signal 128 and the propagation delay to calculate a complex S-parameter for a transmittance.

In accordance with an embodiment, first measurement unit 104 and second measurement unit 106 perform a handshaking over DUT 102 in order to initiate a measurement of the propagation delay. The handshaking ensures a concurrent measurement of the propagation delay.

After performing the handshaking, consider that first frequency generator 108 of first measurement unit 104 produces a first periodic signal $s_1$ having periodic frequency $\omega'$. First periodic signal $s_1$ is represented as:

$$s_1(t) = a_1 \cos(\omega' t) \tag{1}$$

wherein, $a_1$ is a magnitude of first periodic signal $s_1$ and t is a time period.

Further, first periodic signal $s_1$ is transmitted to first transmitter port 110 of first measurement unit 104. First periodic signal $s_1$ transmitted from first transmitter port 110 further propagates through DUT 102 and reaches second receiver port 122 of second measurement unit 106 as a first delayed periodic signal $s_{21}$. First delayed periodic signal $s_{21}$ can be represented as:

$$s_{21}(t) = b_1 \cos(\omega'(t - t_L)) \tag{2}$$

wherein, $t_L$ is a propagation delay of first periodic signal $s_1$ in DUT 102 and $b_1$ is a magnitude of first delayed periodic signal $s_{21}$.

Moving on, second frequency generator 118 of second measurement unit 106 produces a second periodic signal $s_2$ having periodic frequency $\omega''$. Second periodic signal $s_2$ is represented as:

$$s_2(t) = a_2 \cos(\omega''(t + t_p)) \tag{3}$$

wherein, $a_2$ is a magnitude of second periodic signal $s_2$ and $\omega'' t_p$ is a phase difference between first periodic signal $s_1$ and second periodic signal $s_2$ at t=0. A value of $t_p$ remains constant throughout a calculation process of propagation delay and $t_p$ may have any arbitrary value as first measurement unit 104 and second measurement unit 106 are not phase synchronized.

Further, second periodic signal $s_2$ is transmitted to second transmitter port 120 of second measurement unit 106. Second periodic signal $s_2$ transmitted from second transmitter port 120 further propagates through DUT 102 and reaches first receiver port 112 of first measurement unit 104 as a second delayed periodic signal $s_{12}$. Second delayed periodic signal $s_{12}$ is represented as:

$$s_{12}(t) = b_2 \cos(\omega''(t + t_p - t_L)) \tag{4}$$

wherein, $t_L$ is a propagation delay of second periodic signal $s_2$ in DUT 102 and $b_2$ is a magnitude of second delayed periodic signal $s_{12}$.

Moving on, second comparator 124 of second measurement unit 106 calculates a second comparison phase output $\varnothing_{21}$ at a time $t_1$ by comparing a phase of second periodic signal $s_2$ and first delayed periodic signal $s_{21}$. Second comparison phase output $\varnothing_{21}$ is calculated as:

$$\varnothing_{21} = \omega''(t_1 + t_p) - \omega'(t_1 - t_L) \tag{5}$$

Similarly, first comparator 114 of first measurement unit 104 calculates a first comparison phase output $\varnothing_{12}$ at time $t_2$ by comparing a phase of first periodic signal $s_1$ and second delayed periodic signal $s_{12}$. First comparison phase output is calculated as:

$$\varnothing_{12} = (\omega' t_2) - (\omega''(t_2 + t_p - t_L)) \tag{6}$$

First comparison phase output $\varnothing_{12}$ calculated by first comparator 114 and second comparison phase output $\varnothing_{21}$ calculated by second comparator 124 provides an output in a range of $[0, 2\pi)$.

Further, a combined phase $\varnothing$ that corresponds to the propagation delay being measured is calculated by combining first comparison phase output $\varnothing_{12}$ and second comparison phase output $\varnothing_{21}$. Combined phase $\varnothing$ is calculated as:

$$\varnothing = \frac{\varnothing_{12} + \varnothing_{21}}{2} = \frac{(\omega'' - \omega')(t_1 - t_2) + (\omega'' + \omega')t_L}{2} \tag{7}$$

wherein, a first term $[(\omega'' - \omega')(t_1 - t_2)]$ can be approximated to zero in order to calculate the propagation delay from calculated values of combined phase $\varnothing$ and known values of $\omega''$ and $\omega'$. The propagation delay can be calculated as:

$$t_L \approx \frac{2\varnothing}{(\omega'' + \omega')} \tag{8}$$

The first term $[(\omega'' - \omega')(t_1 - t_2)]$ can be approximated to zero by using substantially the same value of the first periodic frequency $\omega'$ and the second periodic frequency $\omega''$.

In accordance with another embodiment, the first term $[(\omega'' - \omega')(t_1 - t_2)]$ can be approximated to zero by using a time synchronization process to achieve substantially the same values of $t_1$ and $t_2$ or to reduce time difference $(t_1 - t_2)$. An embodiment of the time synchronization process is further described in detail in conjunction with FIG. 3 and FIG. 4.

In yet another embodiment, the first term $[(\omega'' - \omega')(t_1 - t_2)]$ can be approximated to zero by using both the time synchronization process to achieve substantially the same values of $t_1$ and $t_2$ and using substantially the same value of the first periodic frequency $\omega'$ and the second periodic frequency $\omega''$.

Moving on, in order to measure the complex S-parameter for the transmittance, magnitude is calculated in addition to a combined phase. First RSSI detector 116 of first measurement unit 104 determines a magnitude of first periodic signal $s_1$ and a magnitude of second delayed periodic signal $s_{12}$. Second RSSI detector 126 of second measurement unit 106 determines a magnitude of first delayed periodic signal $s_{21}$.

Further, the complex S-parameter for the transmittance is calculated by using a ratio of the magnitude of first delayed periodic signal $s_{21}$ to the magnitude of first periodic signal $s_1$ and the propagation delay. When substantially the same frequency $\omega$ is used for first periodic signal $s_1$ and second periodic signal $s_2$, the complex S-parameter for the transmittance is calculated as:

$$S_{21(\omega)} = \frac{b1}{a1} \angle(\omega t_L) \tag{9}$$

wherein, $a_1$ is the magnitude of first periodic signal $s_1$ and $b_1$ is the magnitude of first delayed periodic signal $s_{21}$.

Moving on, system 100 is further configured to perform a measurement of the propagation delay at a plurality of frequencies relative to the propagation delay at a first frequency of the plurality of frequencies in order to prevent phase measurements (as illustrated in equations 5 and 6) from resulting in a poor resolution.

In an exemplary embodiment, a first frequency $\omega_A$ and a second frequency $\omega_B$ are used to measure the propagation delay. At first frequency $\omega_A$, a relation between the propagation delay $t_L$ (as illustrated in equation 7) and a measured combined phase $\emptyset_A$ is represented as:

$$\emptyset_A = \omega_A t_L - 2\pi n \quad (10)$$

wherein, n is a first integer.

At second frequency $\omega_B$, a relation between the propagation delay $t_L$ (as illustrated in equation 7) and a measured combined phase $\emptyset_A$ is represented as:

$$\emptyset_B = \omega_B t_L - 2\pi m \quad (11)$$

wherein, m is a second integer.

Using the relations as illustrated in equations 10 and 11, a difference between combined phase $\emptyset_A$ measured at first frequency $\omega_A$ and the combined phase $\emptyset_B$ measured at the second frequency $\omega_B$ is calculated as:

$$\emptyset_A - \emptyset_B = (\omega_A - \omega_B)t_L - 2\pi(n-m) \quad (12)$$

Further, first frequency $\omega_A$ and second frequency $\omega_B$ are selected to be close enough such that n=m to obtain a required propagation delay measurement with a priori knowledge about a range of possible values of $t_L$. The propagation delay is obtained as:

$$t_L = \frac{\emptyset_A - \emptyset_B}{(\omega_A - \omega_B)} \quad (13)$$

Moving on, system 100 is further configured to generate a plot of a time domain transmittance (TDT). In order to generate the plot of time domain transmittance, frequency sweep measurement is performed that measures the complex S-parameter for the transmittance at plurality of frequencies $\omega_1, \omega_t, \omega_3, \ldots$ and so on. At each frequency point, substantially the same frequency $\omega_i$ is used for first periodic signal $s_1$ and second periodic signal $s_2$. Each measurement uses a unique value of frequency $\omega_i$.

The complex S-parameter for transmittance measured at plurality of frequencies can be represented as:

$$S_{21(\omega_i)} = \left(\frac{b1_{(\omega_i)}}{a1_{(\omega_i)}}\right) L\left(\omega_i t_{L_{(\omega_i)}}\right) \quad (14)$$

wherein, i=1, 2, 3, ... N for N frequency points.

Then, an inverse Fourier transform is applied on the complex S-parameter for transmittance to generate a plot or temporal response of time domain transmittance (TDT).

Further, the temporal response or plot of TDT is used to determine the propagation delay by identifying location of peak in the temporal response. In accordance with another embodiment, the temporal response or plot of TDT is used to determine a plurality of propagation delays corresponding to a plurality of signal paths in DUT 102 from first measurement unit 104 to second measurement unit 106.

Further, phase measurements as illustrated in equation 14 are performed relative to one fixed frequency. The complex S-parameter measured for the phase measurements performed relative to one fixed frequency can be represented as:

$$S_{21(\omega_i)} = \left(\frac{b1_{(\omega_i)}}{a1_{(\omega_i)}}\right) L\left(\omega_i t_{L_{(\omega_i)}} - \omega_0 t_{L_{(\omega_0)}}\right) \quad (15)$$

wherein, $\omega_0$ is a fixed frequency and phase measurement at all other frequencies is represented relative to a phase measurement at $\omega_0$. In an embodiment, substantially equal step sizes of frequencies are generated with a starting frequency $\omega_0$ (as against 0).

Moving on, system 100 further removes adverse effect of reflections on a measurement accuracy when DUT 102 is a bi-directional DUT. When DUT 102 is a bi-directional DUT with concurrent excitation from first measurement unit 104 and second measurement unit 106, second receiver port 122 of second measurement unit 106 receives first delayed periodic signal $s_{21}$ along with a second reflection signal. First delayed periodic signal $s_{21}$ measured at second receiver port 122 of second measurement unit 106 along with the second reflection signal can be represented as:

$$s''_{21(t)} = b_1 \cos(\omega'(t-t_L)) + a''_2 \cos(\omega''(t+t_{r2})) \quad (16)$$

wherein, $a''_2$ is a magnitude and $\omega''t_{r2}$ is a phase shift of the second reflected signal received at second receiver port 122 of second measurement unit 106.

Similarly, first receiver port 112 of first measurement unit 104 receives second delayed periodic signal $s_{12}$ along with a first reflection signal when DUT 102 is a bi-directional DUT with concurrent excitation from first measurement unit 104 and second measurement unit 106. Second delayed periodic signal $s_{12}$ measured at first receiver port 112 of first measurement unit 104 along with the first reflection signal can be represented as:

$$s''_{12(t)} = b_2 \cos(\omega''(t+t_p-t_L)) + a''_1 \cos(\omega'(t+t_{r1})) \quad (17)$$

wherein, $a''_1$ is a magnitude and $\omega't_{r1}$ is a phase shift of the first reflected signal received at first receiver port 112 of first measurement unit 104.

In order to remove effects of the reflections on the measurement accuracy, first delayed periodic signal $s_{21}$ with the second reflection signal and second delayed periodic signal $s_{12}$ with the first reflection signal are corrected by using a first calibration signal and a second calibration signal.

Further, the first calibration signal is measured by performing a first additional measurement with second measurement unit 106 transmitting second periodic signal $s_2$ to a second end of DUT 102 (bi-directional DUT) and disabling first transmitter port 110 of first measurement unit 104 and configuring first transmitter port 110 to provide substantially non-reflective termination. The first calibration signal $s'''_{22}$ is calculated as:

$$s'''_{22(t)} = a''_2 \cos(\omega''(t+t_{r2})) \quad (18)$$

The second calibration signal is measured by performing a second additional measurement with first measurement unit 104 transmitting the first periodic signal $s_1$ to a first end of DUT 102 (bi-directional DUT) and disabling second transmitter port 120 of the second measurement unit 106 and configuring second transmitter port 120 to provide substantially non-reflective termination. The second calibration signal $s'''_{11}$ is calculated as:

$$s'''_{11(t)} = a''_1 \cos(\omega'(t+t_{r1})) \quad (19)$$

First delayed periodic signal $s''_{21}$ measured at second receiver port 122 of second measurement unit 106 along with the second reflection signal is corrected by using the first calibration signal. Corrected first delayed periodic signal $s_{21,corrected}$ 134 is calculated as:

$$s_{21,corrected} = s''_{21} - s'''_{22} \approx s_{21} \quad (20)$$

Second delayed periodic signal $s''_{12}$ measured at first receiver port 112 of first measurement unit 104 along with the first reflection signal is corrected by using the second calibration signal. Corrected second delayed periodic signal $s_{12,corrected}$ 132 is calculated as:

$$s_{12,corrected} = s''_{12} - s''_{11} \approx s_{12} \quad (21)$$

Figure 3:
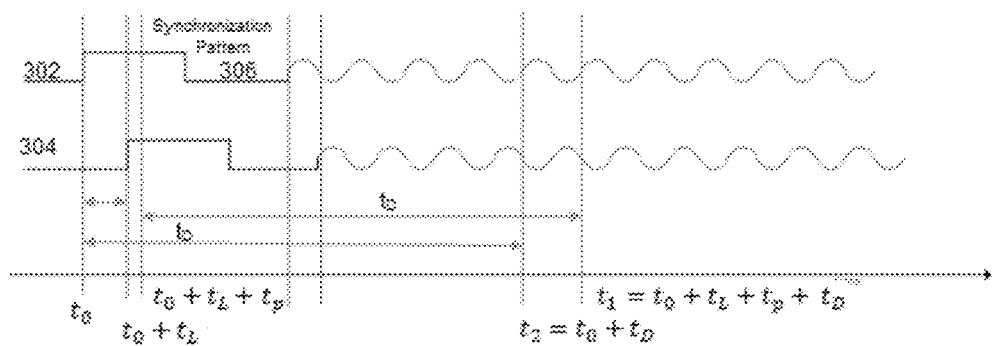
FIG. 3 illustrates a time synchronization process to minimize timing errors in a measurement of a propagation delay of a DUT in accordance with an embodiment of the invention.

FIG. 3 illustrates a time synchronization process to minimize timing errors in a measurement of a propagation delay of DUT 102 in accordance with an embodiment of the invention. As illustrated in FIG. 3, plot 302 represents a timing plot of first measurement unit 104 and plot 304 represents a timing plot of second measurement unit 106.

At time $t_0$, first measurement unit 104 sends a synchronization pattern signal 306 to DUT 102 through first transmitter port 110. A delayed synchronization pattern signal reaches second receiver port 122 of second measurement unit 106 after a propagation delay at time $t_0+t_L$. Further, second receiver port 122 of second measurement unit 106 processes the delayed synchronization pattern signal at time $t_0+t_L+t_p$, where $t_p$ represents a combined effect of internal delay in second measurement unit 106 and a timing error.

After transmitting synchronization pattern signal 306, first frequency generator 108 of first measurement unit 104 starts a transmission of a first periodic signal at frequency $\omega$. Similarly, after processing the delayed synchronization pattern, second frequency generator 118 of second measurement unit 106 starts a transmission of a second periodic signal at substantially the same frequency $\omega$. Thus, second frequency generator 118 of second measurement unit 106 transmits the second periodic signal at frequency $\omega$ concurrently with first frequency generator 108 of first measurement unit 104 transmitting the first periodic signal at frequency $\omega$.

Further, first comparator 114 and first RSSI detector 116 of first measurement unit 104 measure a second delayed periodic signal at time $t_2(=t_0+t_D)$ after a delay $t_D$ from $t_0$. Second comparator 124 and second RSSI detector 126 of second measurement unit 106 measure a first delayed periodic signal at time $t_1(=t_0+t_D+t_L+t_p)$ after a delay $t_D$ from $t_0+t_L+t_p$. Measurements in first measurement unit 104 and second measurement unit 106 are offset by $t_L+t_p$.

Thus, first measurement unit 104 and second measurement unit 106 are configured to perform measurement at a fixed delay after transmitting synchronization pattern signal 306. The fixed delay may be kept small to minimize a cumulation of a phase drift due to a frequency error.

Figure 4:
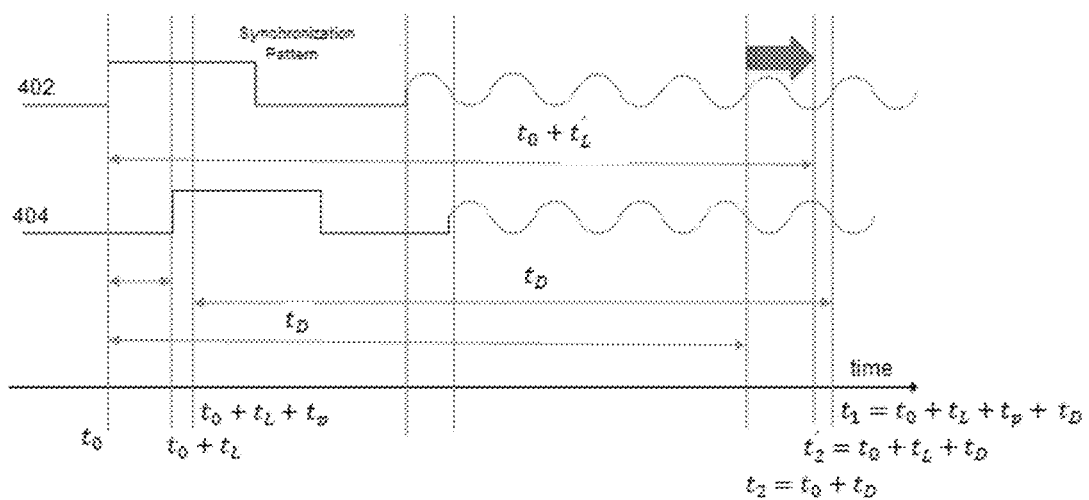
FIG. 4 illustrates iterative measurements performed to reduce a time gap between a measurement of a second delayed periodic signal at a first measurement unit and a measurement of a first delayed periodic signal at a second measurement unit in accordance with an embodiment of the invention.

FIG. 4 illustrates iterative measurements performed to reduce a time gap between a measurement of a second delayed periodic signal at first measurement unit 104 and a measurement of a first delayed periodic signal at second measurement unit 106 in accordance with an embodiment of the invention. As illustrated in FIG. 4, plot 402 represents a timing plot of first measurement unit 104 and plot 404 represents a timing plot of second measurement unit 106.

As illustrated in FIG. 4, a value of delay $t_D$ used by first measurement unit 104 to measure the second delayed periodic signal is adjusted to a new delay $t_D+t'_L$ by using an estimate of propagation delay $t'_L$ from a first estimation measurement. A time of measurement at first measurement unit 104 is adjusted by adjusting the value of delay $t_D$. Thus, a new measurement position $t'_2$ of first measurement unit 104 is closer to the first delayed periodic signal measurement position $t_1$ of second measurement unit 106 resulting in a smaller value of time difference $(t_1-t'_2)$. The smaller value of time difference $(t_1-t'_2)$ results in a smaller error in the measurement of the propagation delay.

Figure 5:
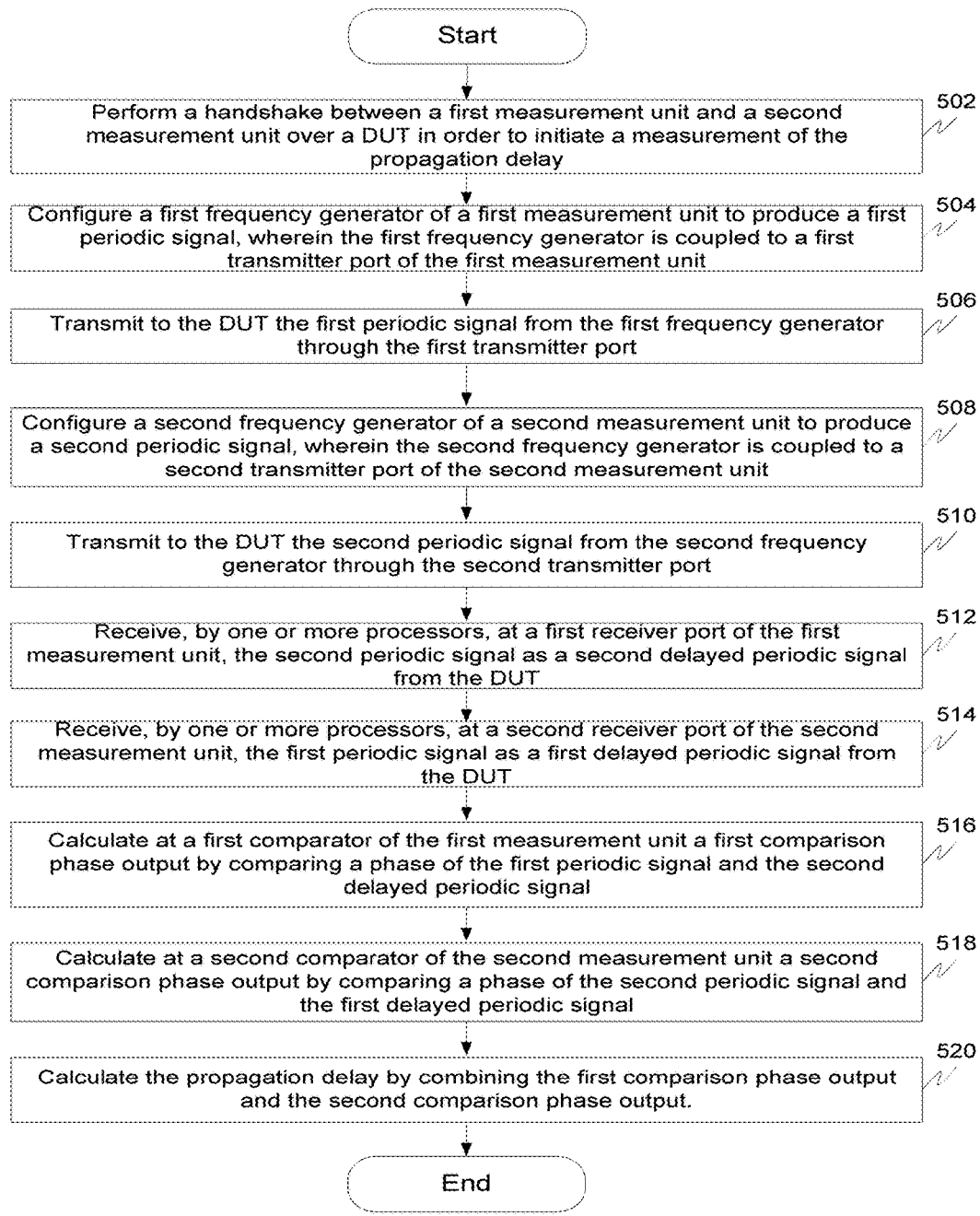
FIG. 5 illustrates a flowchart of a method for measuring a propagation delay of a DUT in accordance with an embodiment of the invention.

FIG. 5 illustrates a flowchart of a method for measuring a propagation delay of DUT 102 in accordance with an embodiment of the invention.

At step 502, a handshake is performed between first measurement unit 104 and second measurement unit 106 over DUT 102 in order in order to initiate a measurement of the propagation delay.

At step 504, first frequency generator 108 of first measurement unit 104 coupled to first transmitter port 110 is configured to produce first periodic signal 128. Then, at step 506, first periodic signal 128 is transmitted to DUT 102 from first frequency generator 108 through first transmitter port 110.

Further, at step 508, second frequency generator 118 of second measurement unit 106 coupled to second transmitter port 120 is configured to produce second periodic signal 130. Then, at step 510, second periodic signal 130 is transmitted to DUT 102 from second frequency generator 118 through second transmitter port 120.

After transmitting first periodic signal 128 and second periodic signal 130 to DUT 102, at step 512, second periodic signal 130 is received at first receiver port 112 of first measurement unit 104 as second delayed periodic signal 132 from DUT 102. Similarly, at step 514, first periodic signal 128 is received at second receiver port 122 of second measurement unit 106 as first delayed periodic signal 134 from DUT 102.

Thereafter, at step 516, a first comparison phase output is calculated at first comparator 114 of first measurement unit 104 by comparing a phase of first periodic signal 128 and second delayed periodic signal 132.

At step 518, a second comparison phase output is calculated at second comparator 124 of second measurement unit 106 by comparing a phase of second periodic signal 130 and first delayed periodic signal 134. Thereafter at step 520, the propagation delay is calculated by combining the first comparison phase output and the second comparison phase output.

Figure 6:
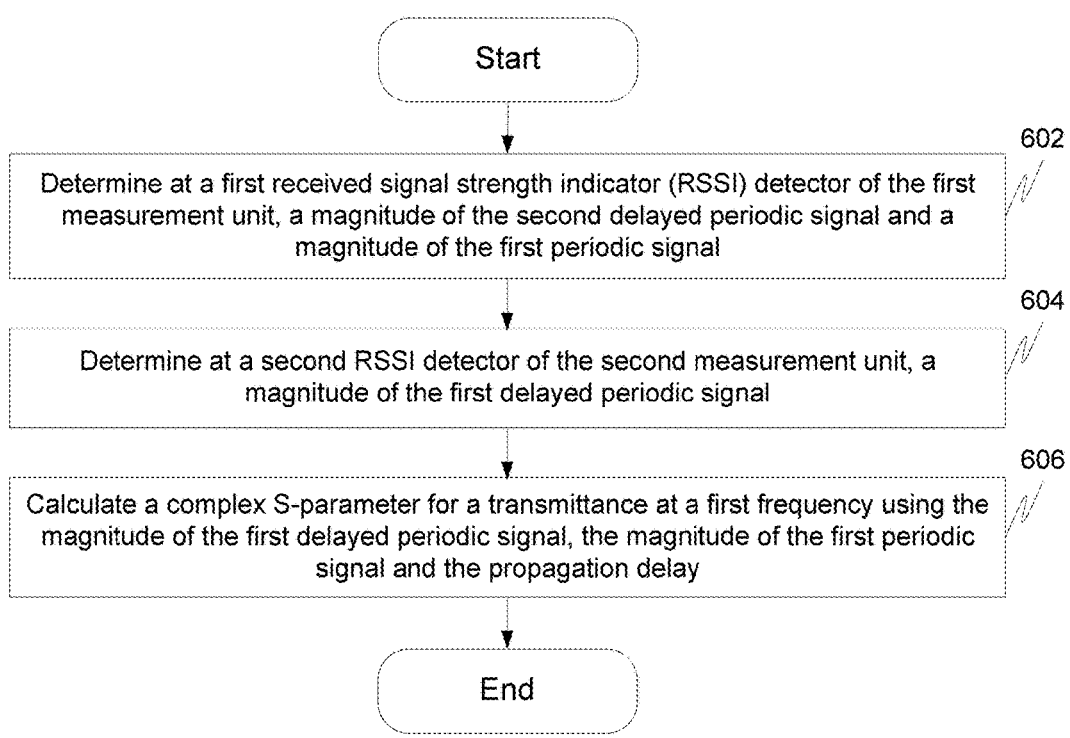
FIG. 6 illustrates a flowchart of a method for calculating a complex S-parameter for transmittance in accordance with an embodiment of the invention.

FIG. 6 illustrates a flowchart of a method for calculating a complex S-parameter for a transmittance in accordance with an embodiment of the invention.

At step 602, a magnitude of second delayed periodic signal 132 and a magnitude of first periodic signal 128 is determined at first RSSI detector 116 of first measurement unit 104.

At step 604, a magnitude of first delayed periodic signal 134 and a magnitude of second periodic signal 130 is determined at second RSSI detector 126 of second measurement unit 106.

Thereafter, at step 606, a complex S-parameter for the transmittance is calculated at a first frequency using the magnitude of first delayed periodic signal 134, first periodic signal 128 and the propagation delay.

Figure 7:
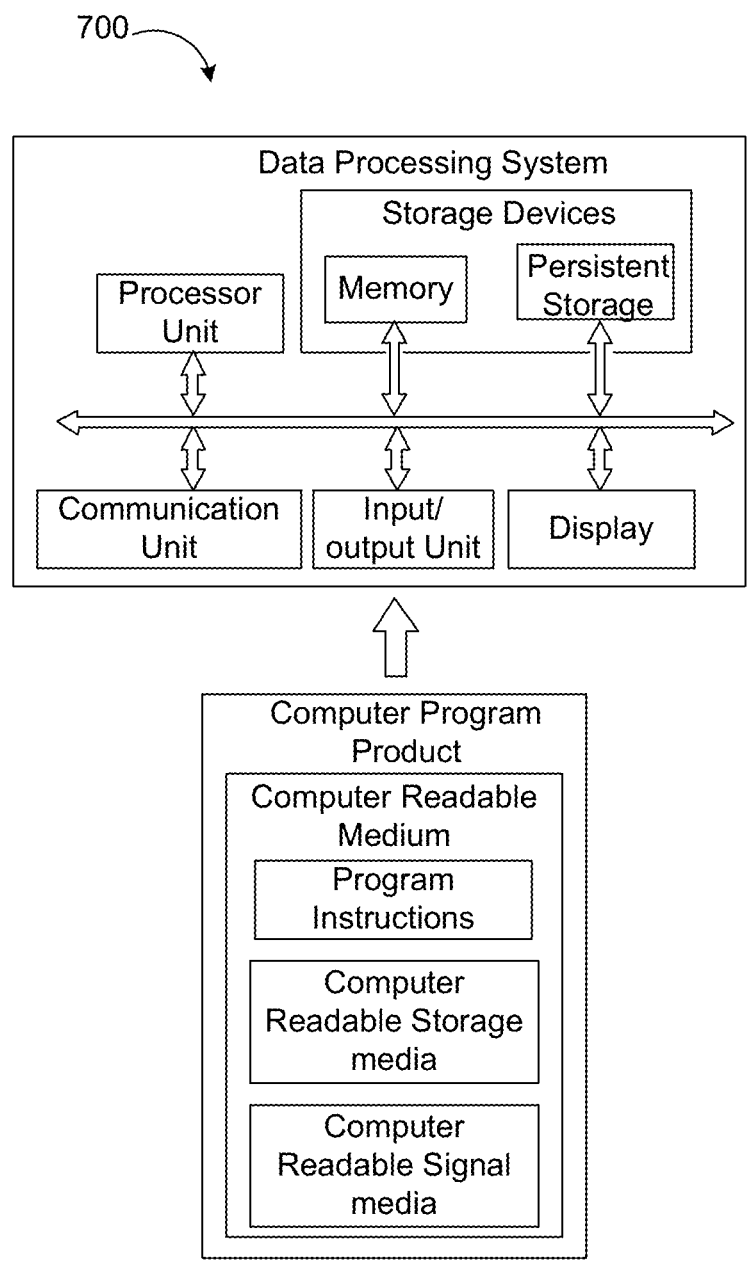
FIG. 7 illustrates a computer program product for measuring a propagation delay of a DUT in accordance with an embodiment of the invention.

FIG. 7 illustrates a computer program product 700 for measuring a propagation delay of DUT 102 in accordance with an embodiment of the invention.

An embodiment of the present invention may relate to computer program product 700 with a non-transitory computer readable medium having program instructions thereon for performing various computer-implemented operations of the method and/or system disclosed herein. The computer readable storage media and program instructions may be those specially designed and constructed for the purposes of the method and/or system disclosed herein, or, they may be of the kind well known and available to those having skill in the computer software arts. Examples of the computer-readable storage media include, but are not limited to, magnetic media, optical media, magneto-optical media and hardware devices that are specially configured to store and execute program instructions. Examples of the program instructions include machine code, such as produced by a compiler, and files containing higher-level code that are executed by a computer using an interpreter. For example, an embodiment of the present invention may be implemented using JAVA®, C++, or other object-oriented programming language and development tools. Aspects of the present invention may also be implemented using Hypertext Transport Protocol (HTTP), Procedural Scripting Languages and the like.

The invention performs a dual-ended propagation delay measurement and a transmittance measurement for a DUT using two independent measurement units that do not have physical or conductive electrical connection between them.

At each measurement unit, a phase comparison output is measured by using a phase comparator that compares a phase of a delayed periodic signal received from the DUT and a periodic signal generated by a phase generator. Further, the propagation delay of the DUT is calculated by combining phase comparison outputs of the two independent measurement units. Thus, a required accuracy in a measurement of the propagation delay can be provided without using a common phase reference between the two independent measurement units.

The invention performs differential multiple phase measurements at the two independent measurement units at a plurality of response frequencies. The invention also minimizes a measurement error by reducing a difference between a time of measurement between the two independent measurement units by performing time synchronization process. Further, the invention reduces adverse effect of reflections on the measurement of the propagation delay in case of a bi-directional DUT.

Those skilled in the art will realize that the above recognized advantages and other advantages described herein are merely exemplary and are not meant to be a complete rendering of all of the advantages of the various embodiments of the invention.

The system, as described in the invention or any of its components may be embodied in the form of a computing device. The computing device can be, for example, but not limited to, a general-purpose computer, a programmed microprocessor, a micro-controller, a peripheral integrated circuit element, and other devices or arrangements of devices, which are capable of implementing the steps that constitute the method of the invention. The computing device includes a processor, a memory, a nonvolatile data storage, a display, and a user interface.

In the foregoing specification, specific embodiments of the invention have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of the invention. The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

What is claimed is:

1. A system for measuring a propagation delay of a device under test (DUT), the system comprising:
   a first measurement unit, wherein the first measurement unit comprises:
      a first frequency generator configured to produce a first periodic signal;
      a first transmitter port;
      a first receiver port; and
      a first comparator;
   a second measurement unit, wherein the second measurement unit comprises:
      a second frequency generator configured to produce a second periodic signal;
      a second transmitter port;
      a second receiver port; and
      a second comparator;
   wherein,
   the first transmitter port of the first measurement unit is configured to transmit the first periodic signal from the first frequency generator to the DUT, wherein the first periodic signal is further transmitted to the second receiver port of the second measurement unit as a first delayed periodic signal;
   the second transmitter port of the second measurement unit is configured to transmit the second periodic signal from the second frequency generator to the DUT, wherein the second periodic signal is further transmitted to the first receiver port of the first measurement unit as a second delayed periodic signal;
   the first comparator of the first measurement unit is configured to calculate a first comparison phase output by comparing a phase of the first periodic signal and the second delayed periodic signal; and
   the second comparator of the second measurement unit is configured to calculate a second comparison phase output by comparing a phase of the second periodic signal and the first delayed periodic signal, wherein the propagation delay is calculated by combining the first comparison phase output and the second comparison phase output.

2. The system according to claim 1, wherein the DUT comprises a forward DUT and a reverse DUT.

3. The system according to claim 1, wherein the DUT is a bi-directional DUT.

4. The system according to claim 1, wherein there is no conductive electrical connection between the first measurement unit and the second measurement unit.

5. The system according to claim 1, wherein a frequency of the first periodic signal is kept substantially the same as a frequency of the second periodic signal in order to minimize a measurement error in a measurement of the propagation delay.

6. The system according to claim 1, wherein the first frequency generator and the second frequency generator are configured to produce periodic signals at a plurality of frequencies.

7. The system according to claim 1 is further configured to calculate a combined phase by combining the first comparison phase output and the second comparison phase output at each frequency of a plurality of frequencies, wherein at each frequency, a relative combined phase is measured relative to the combined phase at a first frequency of the plurality of frequencies and a propagation delay at each frequency is calculated from the relative combined phase at that frequency.

8. The system according to claim 1 further comprises a first received signal strength indicator (RSSI) detector in the first measurement unit and a second RSSI detector in the second measurement unit,
wherein,
the first RSSI detector of the first measurement unit is configured to detect a magnitude of the second delayed periodic signal and a magnitude of the first periodic signal; and
the second RSSI detector of the second measurement unit is configured to detect a magnitude of the first delayed periodic signal.

9. The system according to claim 8 is further configured to calculate a complex S-parameter for a transmittance at a first frequency using the magnitude of the first delayed periodic signal, the magnitude of the first periodic signal and the propagation delay.

10. The system according to claim 9 is further configured to generate a plot of a time domain transmittance (TDT), wherein the plot of the TDT is generated by applying a Fourier transform on the complex S-parameter of the transmittance measured at a plurality of frequencies.

11. The system according to claim 10 is further configured to determine a plurality of propagation delays corresponding to a plurality of signal paths in the DUT from the first measurement unit to the second measurement unit using the plot of the TDT.

12. The system according to claim 1, wherein the first measurement unit is further configured to send a synchronization pattern using the DUT to the second measurement unit to reduce a time difference between a measurement at the first measurement unit and a measurement at the second measurement unit in order to minimize a cumulation of phase drift due to a frequency error.

13. The system according to claim 1 is further configured to correct the first delayed periodic signal and the second delayed periodic signal to remove effects of reflection in a measurement of the propagation delay when a DUT is a bi-directional DUT, wherein the first delayed periodic signal and the second delayed periodic signal are corrected by using a first calibration signal and a second calibration signal.

14. The system according to claim 13, wherein the first calibration signal is measured by performing a first additional measurement with the second measurement unit transmitting the second periodic signal to a second end of the bi-directional DUT and disabling the first transmitter port of the first measurement unit.

15. The system according to claim 13, wherein the second calibration signal is measured by performing a second additional measurement with the first measurement unit transmitting the first periodic signal to a first end of the bi-directional DUT and disabling the second transmitter port of the second measurement unit.

16. A method for measuring a propagation delay of a device under test (DUT), the method comprising:
configuring, by one or more processors, a first frequency generator of a first measurement unit, to produce a first periodic signal, wherein the first frequency generator is coupled to a first transmitter port of the first measurement unit;
transmitting, by one or more processors, to the DUT, the first periodic signal from the first frequency generator through the first transmitter port;
configuring, by one or more processors, a second frequency generator of a second measurement unit, to produce a second periodic signal, wherein the second frequency generator is coupled to a second transmitter port of the second measurement unit;
transmitting, by one or more processors, to the DUT, the second periodic signal from the second frequency generator through the second transmitter port;
receiving, by one or more processors, at a first receiver port of the first measurement unit, the second periodic signal as a second delayed periodic signal from the DUT;
receiving, by one or more processors, at a second receiver port of the second measurement unit, the first periodic signal as a first delayed periodic signal from the DUT;
calculating, by one or more processors, at a first comparator of the first measurement unit, a first comparison phase output by comparing a phase of the first periodic signal and the second delayed periodic signal;
calculating, by one or more processors, at a second comparator of the second measurement unit, a second comparison phase output by comparing a phase of the second periodic signal and the first delayed periodic signal; and
calculating, by one or more processors, the propagation delay by combining the first comparison phase output and the second comparison phase output.

17. The method according to claim 16 further comprises:
determining, by one or more processors, at a first received signal strength indicator (RSSI) detector of the first measurement unit, a magnitude of the second delayed periodic signal and a magnitude of the first periodic signal;
determining, by one or more processors, at a second RSSI detector of the second measurement unit, a magnitude of the first delayed periodic signal; and
calculating, by one or more processors, a complex S-parameter for a transmittance at a first frequency using the magnitude of the first delayed periodic signal, the magnitude of the first periodic signal and the propagation delay.

18. A computer program product for measuring a propagation delay of a device under test (DUT), the computer program product comprising:
a computer readable storage medium and program instructions stored on the computer readable storage medium, the program instructions readable/executable by a processor to cause the processor to:
configure, a first frequency generator of a first measurement unit, to produce a first periodic signal, wherein the first frequency generator is coupled to a first transmitter port of the first measurement unit;
transmit, to the DUT, the first periodic signal from the first frequency generator through the first transmitter port;
configure, a second frequency generator of a second measurement unit, to produce a second periodic signal, wherein the second frequency generator is coupled to a second transmitter port of the second measurement unit;
transmit, to the DUT, the second periodic signal from the second frequency generator through the second transmitter port;

receive, at a first receiver port of the first measurement unit, the second periodic signal as a second delayed periodic signal from the DUT;

receive, at a second receiver port of the second measurement unit, the first periodic signal as a first delayed periodic signal from the DUT;

calculate, at a first comparator of the first measurement unit, a first comparison phase output by comparing a phase of the first periodic signal and the second delayed periodic signal;

calculate, at a second comparator of the second measurement unit, a second comparison phase output by comparing a phase of the second periodic signal and the first delayed periodic signal; and calculate the propagation delay by combining the first comparison phase output and the second comparison phase output.

19. The computer program product according to claim 18, wherein the program instructions further cause the processor to:

determine, at a first received signal strength indicator (RSSI) detector of the first measurement unit, a magnitude of the second delayed periodic signal and a magnitude of the first periodic signal;

determine, at a second RSSI detector of the second measurement unit, a magnitude of the first delayed periodic signal; and calculate a complex S-parameter for a transmittance at a first frequency using the magnitude of the first delayed periodic signal, the magnitude of the first periodic signal and the propagation delay.

20. The computer program product according to claim 19, wherein the program instructions further cause the processor to generate a plot of a time domain transmittance (TDT), wherein the plot of the TDT is generated by applying a Fourier transform on the complex S-parameter of the transmittance measured at a plurality of frequencies.

* * * * *